(12) United States Patent  
Nemoto et al.

(10) Patent No.: US 7,871,505 B2  
(45) Date of Patent: Jan. 18, 2011

(54) SPUTTERING TARGET TRANSPORT BOX

(75) Inventors: Fumiya Nemoto, Ibaraki (JP); Atsushi Inoue, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 1080 days.

(21) Appl. No.: 10/507,235

(22) PCT Filed: Dec. 19, 2002

(86) PCT No.: PCT/JP02/13270

§ 371 (c)(1),
(2), (4) Date: Sep. 9, 2004

(65) Prior Publication Data

US 2005/0092603 A1     May 5, 2005

(30) Foreign Application Priority Data

Mar. 19, 2002    (JP) .............................. 2002-075977

(51) Int. Cl.
| | |
|---|---|
| *C25B 9/00* | (2006.01) |
| *C25B 11/00* | (2006.01) |
| *C25B 13/00* | (2006.01) |
| *C23C 14/00* | (2006.01) |
| *B65D 88/00* | (2006.01) |
| *B65D 81/02* | (2006.01) |
| *B65D 85/00* | (2006.01) |

(52) U.S. Cl. ................... 204/298.12; 220/1.6; 206/523; 206/709; 206/716; 206/722; 206/724

(58) Field of Classification Search ................. D3/273; 62/371; 206/523, 710, 709, 716, 722, 724; 220/1.6; 422/9; 428/34.7; 108/51.1

See application file for complete search history.

(56) References Cited

U.S. PATENT DOCUMENTS

| | | | | | |
|---|---|---|---|---|---|
| 4,836,379 | A | * | 6/1989 | Shaw | 206/523 |
| 5,378,428 | A | * | 1/1995 | Inoue et al. | 422/9 |
| 5,577,616 | A | * | 11/1996 | Liang | 206/710 |
| 5,582,114 | A | | 12/1996 | Feiner | 108/51.1 |
| 5,638,979 | A | * | 6/1997 | Shea | 220/1.6 |
| D382,111 | S | * | 8/1997 | Bardus et al. | D3/273 |

(Continued)

FOREIGN PATENT DOCUMENTS

JP         59-728       1/1984

(Continued)

OTHER PUBLICATIONS

Japanese machine translation of the specification of JP 11011478 [Accessed on Mar. 3, 2008].*

(Continued)

*Primary Examiner*—Alexa D Neckel  
*Assistant Examiner*—Michael Band  
(74) *Attorney, Agent, or Firm*—Howson & Howson LLP

(57) ABSTRACT

The present invention pertains to a sputtering target transport box having a void the size of a sputtering target, wherein supports for mechanical transport are provided to the bottom plate of the transport box, and a wheel for man-powered transport is provided to the edge portion of the bottom plate. Provided thereby is a sputtering target transport box in which the removal and transport of a sputtering target is easy, and which enables the transport of a sputtering target without causing any damage thereto.

20 Claims, 2 Drawing Sheets

U.S. PATENT DOCUMENTS 5,669,233 A * 9/1997 Cook et al. .................... 62/371
5,830,545 A * 11/1998 Frisk ......................... 428/34.7
7,059,475 B2 * 6/2006 Zabka et al. ................ 206/710

FOREIGN PATENT DOCUMENTS

| JP | 61-164126 | | 10/1986 |
| JP | 01290765 A | * | 11/1989 |
| JP | 4-84138 | | 7/1992 |
| JP | 6-18228 | | 3/1994 |
| JP | 11-011478 | | 1/1999 |
| JP | 11350122 A | * | 12/1999 |
| JP | 2000-079942 | | 3/2000 |

OTHER PUBLICATIONS

Patent Abstracts of Japan, 1 page English Abstract of JP 11-011478, Jan. 1999.

Patent Abstracts of Japan, 1 page English Abstract of JP 2000-079942, Mar. 2000.

* cited by examiner

SPUTTERING TARGET TRANSPORT BOX

BACKGROUND OF THE INVENTION

The present invention pertains to a sputtering target transport box in which the removal and transport of a sputtering target is easy, and which enables the transport of a sputtering target without causing any damage thereto.

Generally, a sputtering target employed in the manufacture of semiconductors and the like is gradually growing in size and becoming heavy, and demands for the flatness and surface cleansibility thereof are becoming increasingly tough. Further, in addition metal targets, some targets employ brittle materials such as ceramics, and needs are arising for safely transporting such targets from the target manufacturing plant to the workshop for forming thin films via sputtering with such targets.

Since recent-day targets are highly purified, the unit production cost per target is increasing, and it causes the bigger loss in cost if such target is damaged or broken during its transport.

Meanwhile, there are additional demands seeking simplified handling of the transported target in a plant, for instance, in a semiconductor manufacturing plant, for forming thin films; transporting the transported target without scratching the floor face inside the cleansed building; and transporting and opening of the transported target by one person or few persons.

Conventionally, upon simplifying the transport, there were cases where the target would become damaged or broken by colliding during its transport or opening. Contrarily, when securing the transport in order to prevent the damage or breakage of the target, there are problems such as the opening becomes troublesome, and the transport is hindered due to the increased weight thereof.

SUMMARY OF THE INVENTION

In order to overcome the foregoing problems, an object of the present invention is to provide a sputtering target transport box in which the removal and transport of a sputtering target is easy, and which enables the transport of a sputtering target without causing any damage thereto.

As a result of intense study to achieve the foregoing object, the present inventors discovered that it is possible to provide a sputtering target transport box in which the removal and transport of a sputtering target is easy, and which enables the transport of a sputtering target without causing any damage thereto by providing supports and a wheel to the bottom plate of the transport box.

Based on the foregoing discovery, the present invention provides:

1. A sputtering target transport box comprising a void the size of a sputtering target, wherein supports for mechanical transport are provided to the bottom plate of the transport box, and wheels for man-powered transport are provided to the edge portion of the bottom plate;
2. A sputtering target transport box according to paragraph 1 above, wherein the height from the bottom plate of the supports is greater than the height from the bottom plate of the wheel;
3. A sputtering target transport box according to paragraph 1 or paragraph 2 above, wherein a handle is mounted on the side face or bottom plate on the side opposite to the bottom plate comprising the wheel, and the transport box is inclined during transport with the handle and the load is supported with the wheel such that the supports do not interfere with the floor face;
4. A sputtering target transport box according to any one of paragraphs 1 to 3 above, wherein resin or wood for cushioning the impact with the floor face of a building is affixed to the respective faces of the periphery, corners and supports of the transport box;
5. A sputtering target transport box according to any one of paragraphs 1 to 4 above, wherein the transport box is structured from an outer box and an inner box comprising a void the size of the target, and the inner box may be independently removed from the outer box for transport;
6. A sputtering target transport box according to any one of paragraphs 1 to 5 above, wherein a conductive thin film is affixed to the outer surface of the outer box in order to prevent electrification;
7. A sputtering target transport box according to any one of paragraphs 1 to 6 above, further having an inner frame comprising a void the size of a sputtering target; a plastic inner box comprising a lower plate and an upper plate; and an outer box formed of aluminum, wood or a material in which plastic is affixed to such aluminum or wood and comprising an outer frame, a bottom plate, a top plate and a cover having an inner size that is greater than the inner box; wherein the inner box charged with the sputtering target is further placed in the outer box for transport;
8. A sputtering target transport box according to any one of paragraphs 5 to 7 above, wherein the inner box has a through-type hold;
9. A sputtering target transport box according to any one of paragraphs 5 to 8 above, wherein a cushion material is placed between the outer box and inner box for transport; and
10. A sputtering target transport box according to any one of paragraphs 5 to 9 above, further having a joint capable of removably fixing the outer box cover and outer frame;

DETAILED DESCRIPTION OF THE INVENTION

The present invention is now explained with reference to the drawings.

Figure 1:
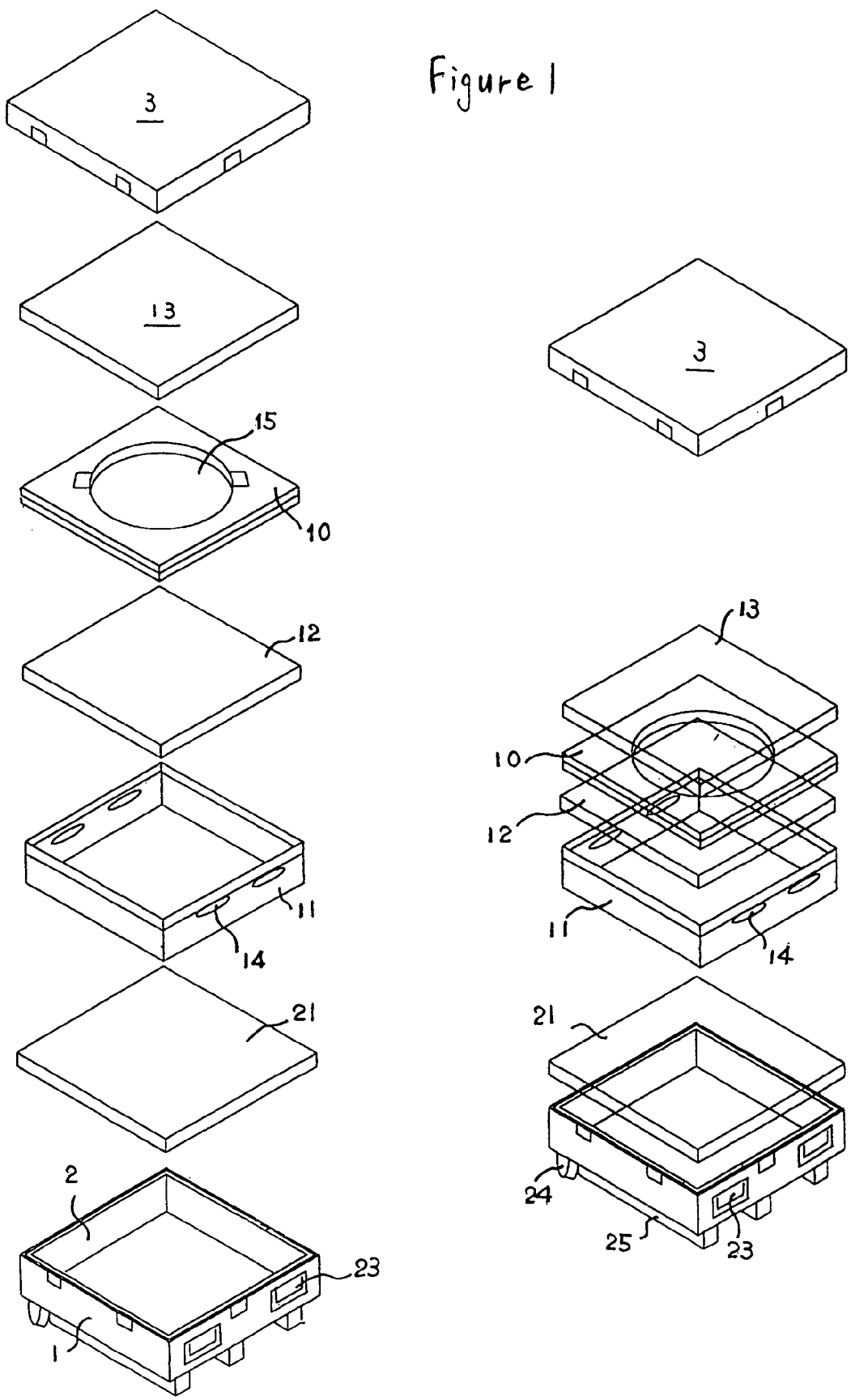
FIG. 1 is an explanatory diagram arranging in order from the top the structural elements of the sputtering target transport box of the present invention, wherein the diagram on the right shows an arrangement closer to the assembly structure in comparison to the diagram on the left.
Figure 2:
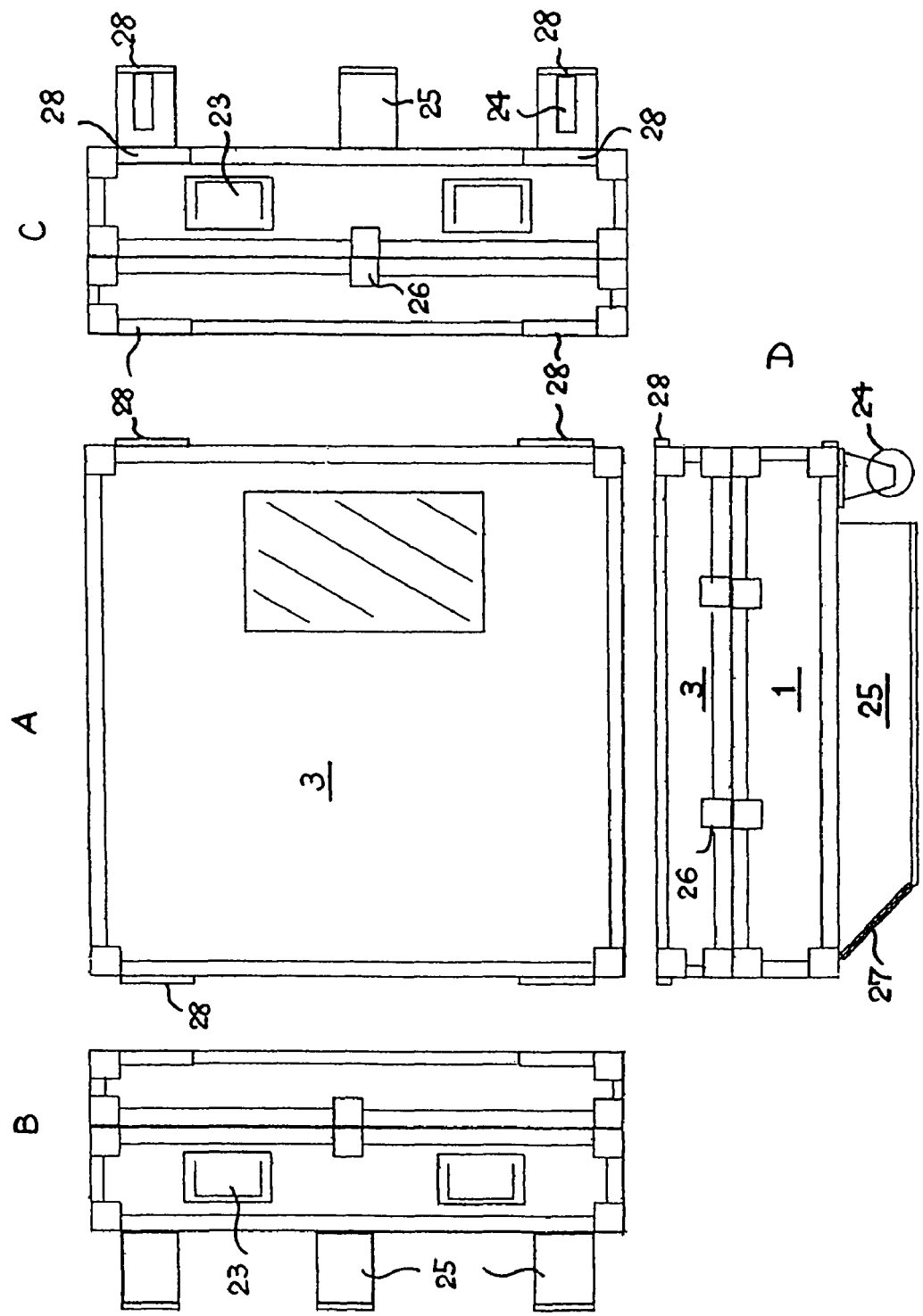
FIG. 2 is an explanatory diagram showing a plan view (A), front view (B), rear view (C) and right side view (D) after the assembly of the sputtering target transport box of the present invention.

The sputtering target transport box of the present invention is, as illustrated in FIG. 1 and FIG. 2, a transport box comprising a void the size of a target, wherein supports 25 for mechanical transport are provided to the bottom plate of the transport box, and a wheel 24 for man-powered transport is provided to the edge portion of the bottom plate.

This transport box may be, as necessary, a double structure transport box structured from a plastic inner box 11 and an outer box 1 formed of aluminum, wood or a material in which plastic is affixed to such aluminum or wood. In addition, the transport box does not necessarily have to be a double structure, and may be a transport box structured from only the outer box 1 and an outer box cover 3. This may be suitably selected in accordance with the target to be handled.

In the case of a transport box structured from the inner box 11 and outer box 1, the inner box 11 has a retention frame 10 comprising a void 15 the size of a target; an inner box cushion material 12 as the buffer material between the bottom plate of the inner box 11 and the target; and an outer box cushion material 13 as the buffer material between the target and the outer box cover 3. These may all be made from plastic for weight saving and cushioning the impact on the target.

The outer box 1 has an outer box cushion material 2 on its inner face. And the outer box 1 also has a single sheet of cushion material 21 for cushioning the impact on the inner box 11 at the top and at the bottom of the inner box 11 (total to two sheets).

By manufacturing these from aluminum, wood or a material in which plastic is affixed to such aluminum or wood as described above, a structure which enables weight saving, impact resistance and outer shape retention is realized. Further, the foregoing plastic may be replaced with expandable resin for further weight saving.

A hold 14 for simplifying the removal of the target from the outer box 1 and the transport thereof may be provided to the inner box 11. It is desirable that this hold 14 is a through-type hold for space and weight saving.

Similarly, a handle 23 may be provided to the outer box 1. This handle 23 of the outer box 1 may also be used for inclining the transport box upon a man-powered transport as described later.

As described above, the outer box 1 has an inner size that is greater than the inner box 11, and, after inserting the inner box 11 into the outer box 1, these are transported upon placing a cushion material made from a relatively hard resin between the outer box 1 and inner box 11. This will prevent the inner box 11 from swaying and further cushion any impact.

A wheel 24 is mounted on one side at the bottom of the outer box 1. As a result, the outer box 1 may be inclined and can be moved on floor face with the wheel 24, thereby enabling the man-powered transport of the outer box. Here, since the wheel is provided at the edge portion of the bottom plate of the outer box 1, when the transport box is inclined, the transport box will be supported only with the wheel, and the supports will not interfere with the floor face. Thus, the transport box may be transported easily with manpower.

In the diagrams, although shown is a case where the wheel 24 is disposed only on a single side (one side) of the bottom plate, this is not limited to only one side. As necessary, plural wheels may be disposed on the other side. In all of these cases, the present invention can have a similar structure and may be functioned in a similar manner.

Moreover, plural supports 25 may be provided to the transport box or the lower part of the outer box 1, and forks of a forklift may be inserted into these supports 25 to raise them for transport, or for placing them on a bed of a truck for transport.

In other words, during a mechanical transport such as with a forklift or truck, the load is supported with the support 25, and, during a man-powered transport, the load is supported with the wheel 24. These methods play an important role in transporting a sputtering target safely and easily.

These supports 25 may be of a shallow shape, or may be of a horseshoe shape. There is no particular limitation on the shape and quantity thereof. It will suffice so as long as the structure enables easy mechanical transport and stable putting on the floor face.

In the relationship between the supports 25 and wheels 24, as a result of making the height from the bottom plate of the outer box 1 of the support to be greater than the height from the bottom plate of the outer box 1 of the wheels 24; that is, such that the wheels 24 do not protrude from the supports 25, swaying and movement can be prevented upon mounting the transport box on the likes of a truck for transport.

A joint 26 such as a rotary joint for removably fixing the outer box cover 3 of the outer box 1, and the outer box 1 may also be provided. As a result, even if the transport box is turned upside down for one reason or another, it is possible to prevent the inner box 11 from falling out of the outer box. Further, an oblique cut 27 may be provided to the side opposite to the wheel 24 of the outer box 1 such that this portion will not hinder the walking of the transporter or movement of the forklift upon transporting the box in an inclined state.

A conductive thin film such as Al may be affixed to the outer surface of the outer box to prevent electrification. In addition, resin 28 for cushioning the impact may also be affixed to the periphery, corners, under the supports and so on of the outer box. This will enable transport without scratching the floor face of a building.

Next, an example of the operation upon transporting and opening a target is explained with the sputtering target transport box of the present invention.

Foremost, the inner box cushion material 12 is inserted into the inner box 11. After insertion, a target is inserted into a void 15 of the retention frame 10, and the inner box cushion material 13 is respectively mounted and then inserted into the inner box 11. The inner box 11 with the target inserted therein is thereby formed.

Next, fingers are placed into the hold 14 of this inner box 11 to raise and insert this into the outer box 1. Since the outer box 1 is larger than the inner box 11, the insertion can be conducted easily. After insertion into the outer box 1, a cushion material formed from relatively hard resin is inserted into the gap so as to fix the inner box 11 to the outer box 1. This cushion material may also be set inside the outer box beforehand so as to be formed integrally with the outer box.

Next, this target transport box is raised with the handle 23, and moved to a transport device (not shown). Forks of a forklift may be inserted between the plurality of supports 25 provided at the lower part of the outer box in order to raise and transport this target transport box. Moreover, the target transport box may be inclined to use the wheel 24 to roll the outer box for transport with manpower.

When these are light, the handle 23 may be used to raise the transport box and may be transported with one person or two persons. As described above, the target transport box of the present invention is characterized in that it can be transported easily. Further, since a cut 27 is provided to the opposite side of the wheel 24 of the outer box 1, upon transporting the box in an inclined state, this will not hinder the walking of the transporter or movement of the forklift.

When using the target in a plant, foremost, the rotary joint 26 fixing the outer box cover 3 and the outer box 1 is released. Next, after opening the cover 3, fingers are placed in the hold 14 to raise and remove the inner box. The insertion-type cushion material may be removed together with the inner box 11 simultaneously, or before or after the cushion material is removed.

The inner box cushion material 13 is removed from the inner box 11, and the target is then removed from the void 15 of the retention frame 10.

The resin 28 affixed to the periphery, corners, under the supports and so on of the outer box plays the role of preventing scratches upon the target transport box colliding with peripheral machines and equipment, or the floor face.

Not only can a single sheet of sputtering target be transferred, a plurality of sputtering targets may be simultaneously placed in a transport box for transport. Here, although the total weight of the transport box may be roughly 30 to 100 kg in some cases, the sputtering target transport box of the present invention enables the safe and easy transport even in the foregoing case.

Accordingly, the present invention yields a superior effect in that it enables the easy removal and transport of a sputtering target, and further enables the operation and transport of a sputtering target without causing any damage thereto.

The invention claimed is:

1. A sputtering target transport box, comprising:
    a plate-shaped, disc-shaped sputtering target made of a metal or ceramic material and having first and second opposite planar faces and an outer annular peripheral edge;
    an inner sputtering target retention frame defining a void of a size matching a size and shape of said disc-shaped sputtering target, said sputtering target being positioned in said void within said retention frame such that said retention frame extends continuously about, directly contacts and supports said outer annular peripheral edge of said sputtering target in a manner preventing movement of said sputtering target relative to said retention frame;
    a plastic inner box having a planar lower cushion plate and a planar upper cushion plate, said retention frame and said sputtering target being positioned within said inner box sandwiched between said planar lower and upper cushion plates such that movement of said retention frame and sputtering target relative to said inner box is prevented and such that said planar lower and upper cushion plates extend completely across and cover said void and directly contact, cushion and buffer said first and second opposite planar faces of said sputtering target and such that said plate-shaped sputtering target is entirely encapsulated, cushioned, and in direct engagement with said retention frame and planar lower and upper cushion plates;
    a separate outer box formed of aluminum or wood and having an outer frame, a bottom plate, and a cover providing an inner size that is greater than said inner box, the inner box charged with the sputtering target is insertable in a horizontal position within the outer box for transport and is independently removable from the outer box, said lower cushion plate being firmly held in position on said bottom plate via said inner box and said upper cushion plate being firmly held in position via contact with said cover so that, during transport of the transport box, a damaging force exerted on the transport box is buffered by said lower and upper cushion plates supported by said bottom plate and said cover plate, respectively, and is prevented from being exerted on said first and second opposite faces and said peripheral side edge of said sputtering target contained within the transport box; and
    stationary supports for mechanical transport extend from the bottom plate of said outer box and wheels for man-powered transport are mounted directly to and integral with said bottom plate adjacent only a rear edge of said bottom plate and not adjacent an opposite front edge of said bottom plate, the height of the supports is greater than the height that each of the wheels extends from the bottom plate of the outer box such that the outer box is supported on said wheels only when the outer box is inclined on a floor face.

2. A sputtering target transport box according to claim 1, wherein a handle is mounted on a side face of the outer box opposite the wheels and at a location above said bottom plate and supports, and wherein the transport box is inclined during transport when utilizing the handle such that the transport box is supported on the wheels and the supports do not interfere with the floor face.

3. A sputtering target transport box according to claim 2, wherein a resin or wood material is affixed to respective faces of the periphery, corners and supports of the outer box to cushion impact with the floor face of a building.

4. A sputtering target transport box according to claim 3, wherein a conductive thin film is affixed to an outer surface of the outer box to prevent electrification.

5. A sputtering target transport box according to claim 4, wherein a through-type hold is provided on the inner box adjacent an upper rim of said inner box to simplify removal of said inner box from said outer box.

6. A sputtering target transport box according to claim 5, wherein a cushion material is provided between the outer box and inner box.

7. A sputtering target transport box according to claim 6, further comprising a joint removably fixing the cover of the outer box to the outer frame of the outer box.

8. A sputtering target transport box according to claim 1, wherein a resin or wood material is affixed to respective faces of the periphery, corners and supports of the outer box to cushion impact with the floor face of a building.

9. A sputtering target transport box according to claim 8, wherein a conductive thin film is affixed to an outer surface of the outer box to prevent electrification.

10. A sputtering target transport box according to claim 9, wherein a through-type hold is provided on the inner box adjacent an upper rim of said inner box to simplify removal of said inner box from said outer box.

11. A sputtering target transport box according to claim 10, wherein a cushion material is provided between the outer box and inner box.

12. A sputtering target transport box according to claim 11, further comprising a joint removably fixing the cover of the outer box to the outer frame of the outer box.

13. A sputtering target transport box according to claim 1, wherein a conductive thin film is affixed to an outer surface of the outer box to prevent electrification.

14. A sputtering target transport box according to claim 13, wherein a through-type hold is provided on the inner box adjacent an upper rim of said inner box to simplify removal of said inner box from said outer box.

15. A sputtering target transport box according to claim 14, wherein a cushion material is provided between the outer box and inner box.

16. A sputtering target transport box according to claim 15, further comprising a joint removably fixing the cover of the outer box to the outer frame of the outer box.

17. A sputtering target transport box according to claim 1, wherein a through-type hold is provided on the inner box adjacent an upper rim of said inner box to simplify removal of said inner box from said outer box.

18. A sputtering target transport box according to claim 17, wherein a cushion material is provided between the outer box and inner box.

19. A sputtering target transport box according to claim 1, wherein a cushion material is provided between the outer box and inner box.

20. A sputtering target transport box according to claim 1, further comprising a joint removably fixing the cover of the outer box to the outer frame of the outer box.

* * * * *